(12) United States Patent
Ko

(10) Patent No.: US 9,016,234 B2
(45) Date of Patent: Apr. 28, 2015

(54) MASK HOLDING DEVICE CAPABLE OF CHANGING MAGNETIC MEANS AND DEPOSITION EQUIPMENT USING THE SAME

(75) Inventor: Jung-Woo Ko, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 819 days.

(21) Appl. No.: 13/235,646

(22) Filed: Sep. 19, 2011

(65) Prior Publication Data

US 2012/0204794 A1   Aug. 16, 2012

(30) Foreign Application Priority Data

Feb. 14, 2011   (KR) ......................... 10-2011-0012873

(51) Int. Cl.
| C23C 16/00 | (2006.01) |
| C23F 1/00 | (2006.01) |
| H01L 21/306 | (2006.01) |
| C23C 14/04 | (2006.01) |
| C23C 14/12 | (2006.01) |

(52) U.S. Cl.
CPC ............... *C23C 14/042* (2013.01); *C23C 14/12* (2013.01)

(58) Field of Classification Search
CPC .... C23C 14/042; C23C 14/044; C23C 14/24; C23C 16/042; C23C 14/505; C23C 14/50; H01J 9/20; H01J 37/32623; H01J 37/32633; B05B 13/0285; B05B 15/0475; B05B 15/045; H01L 21/67069

USPC ........ 118/720, 721, 500, 504, 505; 156/345.3
See application file for complete search history.

(56) References Cited

U.S. PATENT DOCUMENTS

| 4,963,921 | A | 10/1990 | Kariya et al. |
| 5,608,773 | A | 3/1997 | Korenaga et al. |
| 5,662,785 | A | * 9/1997 | Schertler .................. 204/298.25 |
| 6,888,621 | B2 | 5/2005 | Araki et al. |
| 6,960,772 | B1 | 11/2005 | Johnson et al. |
| 7,303,635 | B2 | 12/2007 | Yamaguchi |
| 7,396,558 | B2 | 7/2008 | Fujimori et al. |
| 7,432,116 | B2 | 10/2008 | Yamazaki et al. |
| 7,521,268 | B2 | 4/2009 | Aoki et al. |
| 7,651,722 | B2 | 1/2010 | Mori et al. |
| 2002/0139303 | A1 | 10/2002 | Yamazaki et al. |
| 2006/0086321 | A1 | 4/2006 | Brody et al. |
| 2006/0196802 | A1* | 9/2006 | Jung et al. ....................... 206/557 |
| 2007/0048893 | A1* | 3/2007 | Noh et al. ......................... 438/82 |
| 2009/0058285 | A1 | 3/2009 | Yamazaki et al. |
| 2010/0025237 | A1 | 2/2010 | Kim et al. |

FOREIGN PATENT DOCUMENTS

| KR | 2001-0057828 A | 7/2001 |
| KR | 10-2005-0091919 A | 9/2005 |
| KR | 10-2006-0068682 A | 6/2006 |
| KR | 10-2009-0108420 A | 10/2009 |
| KR | 1020100085514 A | 7/2010 |

* cited by examiner

*Primary Examiner* — Keath Chen
(74) *Attorney, Agent, or Firm* — Robert E. Bushnell, Esq.

(57) ABSTRACT

A mask holding device has a replaceable magnetic means, and a deposition apparatus for an organic light emitting device includes the mask holding device. The mask holding device is provided with magnets, and the magnets can be replaced as required so as to change the magnetic force of the mask holding device.

14 Claims, 5 Drawing Sheets

MASK HOLDING DEVICE CAPABLE OF CHANGING MAGNETIC MEANS AND DEPOSITION EQUIPMENT USING THE SAME

CLAIM OF PRIORITY

This application makes reference to, incorporates the same herein, and claims all benefits accruing under 35 U.S.C. §119 from an application earlier filed in the Korean Intellectual Property Office on the 14 Feb. 2011 and there duly assigned Serial No. 10-2011-0012873.

BACKGROUND OF THE INVENTION

1. Field of the Invention

The present invention relates to a mask holding device having a replaceable magnetic means, and a deposition apparatus for an organic light emitting device including the same, in which the mask holding device is provided with magnets, and the magnets can be replaced as required so as to change the magnetic force of the mask holding device.

2. Description of the Prior Art

As semiconductor industries and electronic display industries have rapidly developed, flat panel displays (FPDs), such as a Liquid Crystal Display (LCD) Device, a Plasma Display Panel (PDP), an Electro Luminescent Display (ELD), a Vacuum Fluorescent Display (VFD), and an Organic Light Emitting Display (OLED) Device, have been widely used in real life.

From among such FPDs, the OLED, which has been recently highly spotlighted, includes an anode, an organic layer, and a cathode stacked on a substrate. In an organic emitting layer (EL) included in the organic layer, recombination of a hole and an electron forms an exciton which emits light.

Methods for generating the organic layer as described above include a physical vapor deposition method, such as a vacuum evaporation method, an ion plating method and a sputtering method, a chemical vapor deposition (CVD) method through gas reaction, and the like. From these methods, the CVD method through gas reaction is widely used in order to form a thin film layer such as an organic film of an organic light emitting device. Also, for this purpose, a vacuum deposition apparatus using organic substances is mainly used.

In general, in a process for manufacturing a semiconductor device or an organic light emitting device, for fabrication of a thin film layer on a substrate, the substrate is attached to a substrate holder, a mask formed with openings, each having a desired shape, is positioned between an evaporation source and the substrate, and then the thin film layer is fabricated with a predetermined pattern on the substrate by using various methods, such as deposition.

In general, the mask is used to fabricate a thin film layer in a chamber while being, together with a substrate, attached to a substrate holder. In order to hold the mask, a mechanical fixing method or a magnetic fixing method is used. The mechanical fixing method employs a pin, a clip, or the like. The magnetic fixing method employs a permanent magnet or an electromagnet in order to hold a substrate and a mask, considering that the mask includes a magnetic material.

In such a conventional deposition apparatus employing a magnetic fixing method, in some cases, an appropriate magnetic force required for the size and the material of the mask and the substrate cannot be applied for fixing the mask on the substrate.

Moreover, an optimum magnetic force required for tightly attaching the mask on the substrate varies according to the size, the resolution, the type (e.g., slit type, dot type, etc.) and the material of the mask. Thus, it is necessary to supply an appropriate magnetic force according to the size, the resolution, the type and the material of the mask.

For example, when an excessively high magnetic force is used to bring the mask into contact with the substrate, wiring or barriers, which are formed in the substrate by photoresist or the like, may be damaged by an effect of the magnetic field. On the other hand, when a magnetic force is weaker than needed, it is impossible to properly attach the mask to the substrate.

Furthermore, in a conventional deposition apparatus, a magnetic means is attached to a structure within the chamber. In order to replace the magnetic means, the chamber is required to be vacuum-released and opened. Such vacuum-releasing and opening of the chamber may result in a great loss in view of a deposition process.

Accordingly, there is required a magnetic means which supplies an optimum magnetic force according to the size, the resolution, the type and the material of the mask, and which brings the mask into contact with the substrate while preventing the mask from being deformed by the magnetic force.

SUMMARY OF THE INVENTION

The present invention has been developed to solve the above-mentioned problems occurring in the prior art. An object of the present invention is to provide a mask holding device provided with a magnetic means which can supply an optimum magnetic force according to the size, the resolution, the type and the material of a mask.

The present invention provides a mask holding device using a permanent magnet, in which the strength of a magnetic force can be adjusted as required.

In addition, the present invention provides a mask holding device using a permanent magnet, in which the permanent magnet can be easily replaced.

Furthermore, the present invention provides a deposition apparatus provided with the above described mask holding device.

Finally, the present invention provides a deposition apparatus in which a permanent magnet can be replaced without releasing the vacuum state of the deposition apparatus.

In accordance with an aspect of the present invention, a mask holding device comprises: substrate holder for holding a substrate, and a magnetic means inserted in the substrate holder.

The substrate holder is formed in a flat panel shape, and has a receiving space formed therein, wherein an opening is formed in at least one of the lateral sides of the substrate holder and the opening leads to the receiving space.

Also, the magnetic means includes a cassette means formed with grooves for disposing magnets, and the magnets are disposed in the grooves of the cassette means. The magnetic means is detachably disposed in the receiving space of the substrate holder through the opening of the substrate holder.

According to one exemplary embodiment of the present invention, a plurality of permanent magnets are disposed in the magnetic means, and the permanent magnets are disposed in such a manner that respective adjacent magnets can have opposite polarities.

In addition, each of the magnets disposed in the cassette means can also be detachably disposed.

Furthermore, each of the magnets may be disposed in such a manner that an axis connecting an N-pole to an S-pole is perpendicular to a plane of the cassette means.

According to one exemplary embodiment of the present invention, the area of the cassette means may be equal to or larger than that of the substrate so that a magnetic force generated by the magnetic means can be applied throughout the entire area of the mask disposed on the substrate.

In accordance with another aspect of the present invention, there is provided a deposition apparatus including the mask holding device.

The deposition apparatus comprises: a chamber which is capable of forming a vacuum atmosphere and which provides a processing space for forming a deposition layer on a substrate; an evaporator source disposed at a bottom of the chamber and which stores an evaporant, and which evaporates the evaporant so that the evaporated evaporant is jetted to the processing space; and a mask holding device disposed at an opposite side of a mask and across the substrate, and which holds the mask on the substrate by a magnetic force.

According to one exemplary embodiment of the present invention, at the chamber, a passage leading to the outside, which allows the magnetic means to be introduced or removed from/to the outside, may be provided. When the magnetic means is replaced, the magnetic means can be moved through the passage.

According to an exemplary embodiment of the present invention, the passage leads to the opening of the substrate holder, and the receiving space of the substrate holder is kept airtight in areas except for the opening.

According to an exemplary embodiment of the present invention, the deposition apparatus may be further provided with a carrying means for carrying the magnetic means, introduced from outside the chamber, to the opening of the substrate holder.

According to an exemplary embodiment of the present invention, the substrate holder's side wall having the opening leads to the chamber's side wall, apart of the chamber's side wall corresponding to the opening is opened, and the receiving space of the substrate holder is kept airtight in areas except for the opening.

The mask holding device and the deposition apparatus, according to the present invention, include a magnetic means, in which magnets disposed in the magnetic means can be replaced. Thus, it is possible to supply an optimum magnetic force according to the size, the resolution, the type, and the material of a mask.

When the deposition apparatus according to the present invention is used, an optimum magnetic force corresponding to the size, the resolution, the type and the material of a mask is supplied. Thus, it is possible to prevent the mask from being deformed by the magnetic force while tightly attaching the mask to the substrate. This allows precise and reliable deposition to be carried out.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described in more detail with reference to the accompanying drawings.

Figure 1:
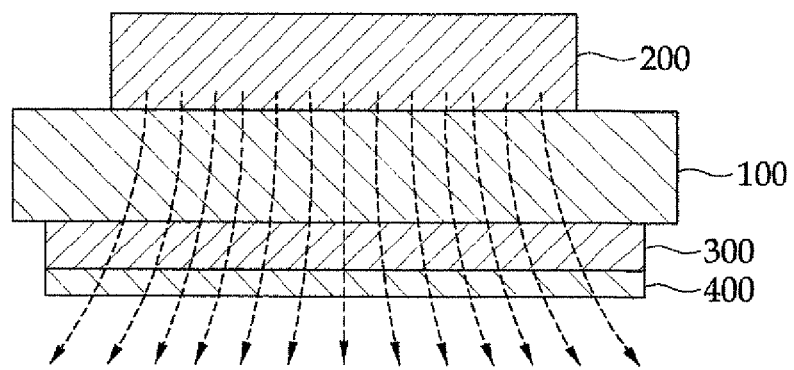
FIG. 1 is a schematic view illustrating a state where a substrate and a mask are fixed by a mask holding device.

FIG. 1 is a schematic view illustrating a state where a substrate and a mask are fixed by a mask holding device.

In the structure of FIG. 1, at the upper side of a substrate holder 100, a magnetic means 200 such as a permanent magnet or an electromagnet is positioned, and at the lower side of the substrate holder 100, a substrate 300 and a mask 400 are held by using a magnetic force of the magnetic means 200.

Figure 2:
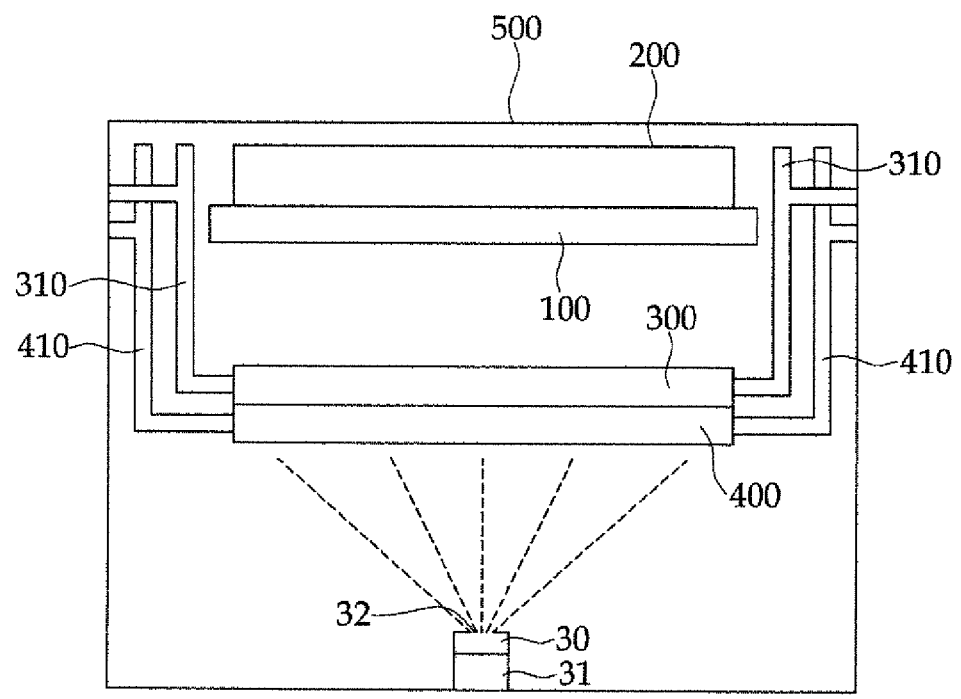
FIG. 2 is a view illustrating a deposition apparatus employing the above described mask holding device.

FIG. 2 is a view illustrating a deposition apparatus employing the above described mask holding device.

As shown in FIG. 2, in the deposition apparatus, within a chamber 500, the substrate holder 100, the magnetic means 200, the substrate 300, and the mask 400 are disposed. Also, at the bottom of the vacuum chamber 500, an evaporation source 30 including an evaporant 31 is disposed. At left and right sides of the substrate 300, substrate clamp units 310 are provided, and at left and right sides of the shadow mask 400, mask clamp units 410 are provided.

The chamber 500 is adjusted in such a manner that foreign substances cannot be introduced from the outside, and a vacuum state can be achieved in the chamber. One or more evaporation sources 30 may be disposed at the bottom of the chamber 500. The evaporant 31, which is a material to be deposited, is received in the evaporation source 30. At the upper side of the evaporation source 30, a vent 32 is formed. Through the vent 32, the evaporant 31 is jetted and deposited on the substrate 300. The mask 400 is positioned at the lower side of the substrate 300 so that the evaporant material can be deposited on a required area of the substrate 300.

The substrate clamp units 310 disposed at left and right sides of the substrate 300, and the mask clamp units 410 disposed at left and right sides of the mask 400, not only adjust positions of the substrate 300 and the mask 400, respectively, but also perform the role of positioning the substrate 300 and the mask 400.

Hereinafter, the operational process of the deposition apparatus will be described. After the substrate 300 and the mask 400 are positioned by the clamp units 310 and 410, respectively, a magnetic force from the magnetic means 200 is supplied to the mask 400 via the substrate 300. Accordingly, the mask 400 is fixed on the substrate 300. Then, the evaporator source 30, including the evaporant 31 therein, is heated and the evaporant 31 is evaporated or sublimated, and thus deposited on the substrate 300, which is exposed through the mask 400.

However, in such a deposition apparatus, the magnetic means 200 has a fixed strength of magnetic force. Thus, in some cases, an appropriate magnetic force required for the sizes and the materials of the mask 400 and the substrate 300 cannot be applied for fixing the mask 400 on the substrate 300.

As displays recently have shown a tendency to have high resolution and a large size, a mask has no option but to be diversified. Also, according to a change of working environment, a material for the mask 400 has been recently diversified. Accordingly, an optimum magnetic force required for tightly attaching the mask 400 on the substrate 300 varies according to the size, the resolution, the type (e.g., slit type, dot type, etc.) and the material of the mask 400. Thus, it is necessary to supply an appropriate magnetic force according to the size, the resolution, the type and the material of the mask 400.

For example, when an excessively high magnetic force is used to bring the mask 400 into contact with the substrate 300, wiring or barriers, which are formed in the substrate 300 by photoresist or the like, may be damaged by an effect of the magnetic field. On the other hand, when a magnetic force is weaker than needed, it is impossible to properly attach the mask 400 on the substrate 300.

Figure 3:
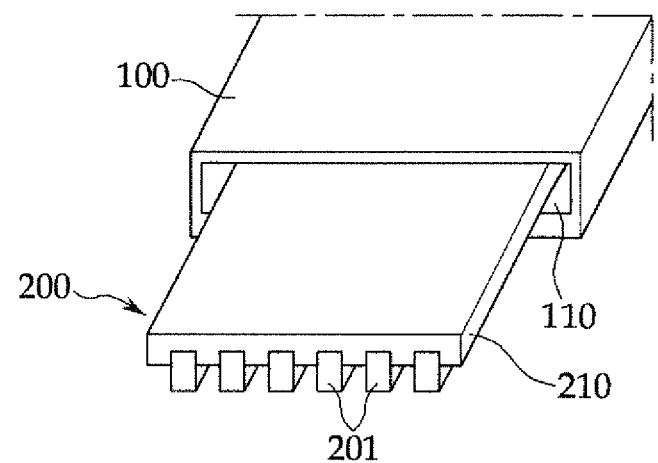
FIG. 3 is a view illustrating a mask holding device according to one embodiment of the present invention.

FIG. 3 is a view illustrating a mask holding device according to one embodiment of the present invention.

As shown in FIG. 3, the mask holding device according to the present invention includes a substrate holder 100 for holding a substrate and a magnetic means 200 inserted into the substrate holder 100.

Further referring to FIG. 3, the substrate holder 100 is formed in a flat panel shape and has a receiving space therein. In at least one of the lateral sides of the substrate holder, an opening 110 is formed, through which opening 110 the receiving space can lead to the outside.

The magnetic means 200 includes: a cassette means 210 formed with grooves for disposing magnets 201 therein; and magnets 201 disposed in the grooves of the cassette means 210.

The magnetic means 200 is disposed in the receiving space of the substrate holder 100 through the opening 110 of the substrate holder 100. Moreover, the magnetic means 200 is detachably disposed in the receiving space of the substrate holder 100, and may be replaced as required.

According to one embodiment of the present invention, in the magnetic means 200, a plurality of permanent magnets 201 is disposed. The permanent magnets 201 are disposed in such a manner that respective adjacent magnets can have opposite polarities, as can be seen in FIGS. 4 thru 6 discussed below.

According to one embodiment of the present invention, the magnets 201 disposed on the cassette means 210 can also be detachable. In other words, the cassette means 210 is designed in such a manner that the magnets 201 are detachable. Thus, when it is required to change the magnetic force of the magnetic means 200, it is possible to easily change the magnetic force of the magnetic means by replacing the magnets 201.

Figure 4:
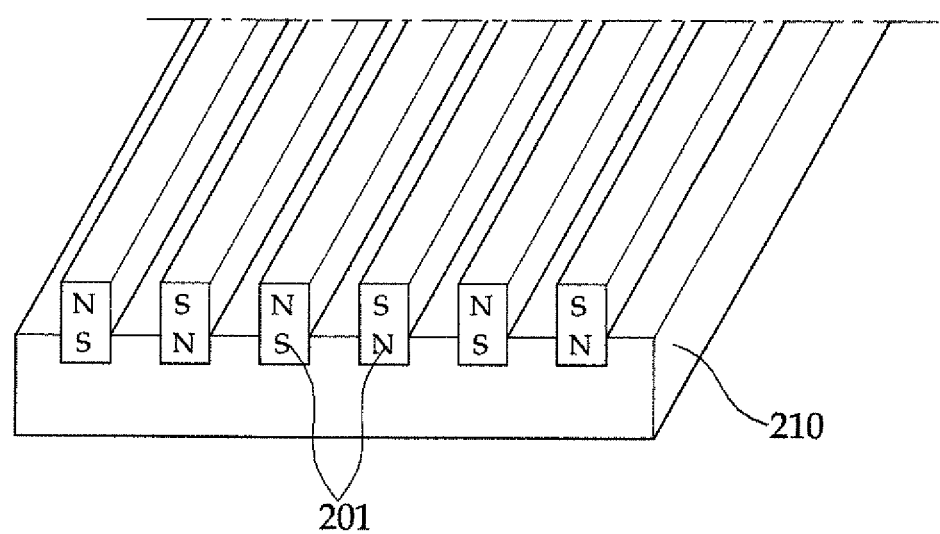
FIG. 4 is a view illustrating a magnetic means according to one embodiment of the present invention.

FIG. 4 is a view illustrating a magnetic means according to one embodiment of the present invention; FIG. 5 is a view illustrating a magnetic means according to another embodiment of the present invention; and FIG. 6 is a cross-sectional view illustrating a magnetic means according to one embodiment, in which magnets are disposed in grooves of a cassette means.

Figure 5:
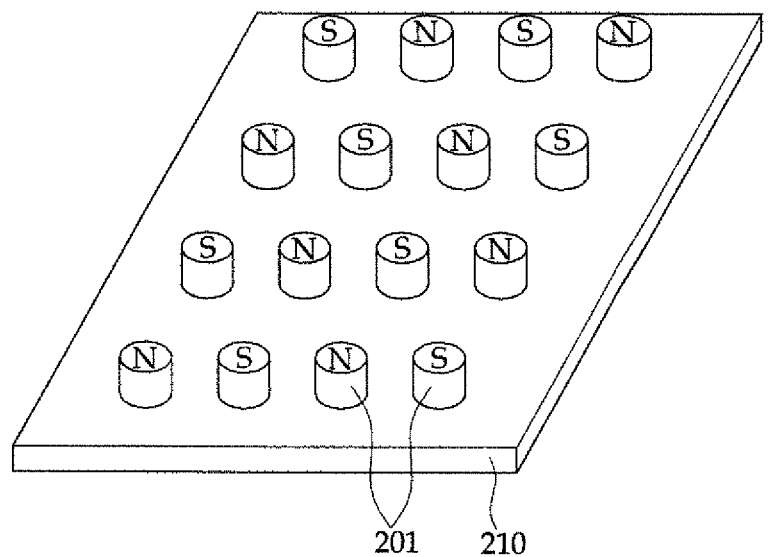
FIG. 5 is a view illustrating a magnetic means according to another embodiment of the present invention.
Figure 6:
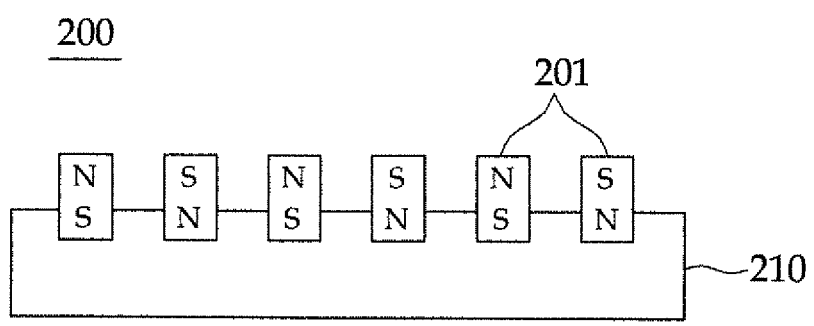
FIG. 6 is a cross-sectional view illustrating a magnetic means according to one embodiment, in which magnets are disposed in grooves of a cassette means.

More specifically, FIGS. 4 and 5 are views illustrating examples of the magnetic means 200 according to the present invention. In FIG. 4, long bar magnets 201 are disposed in the cassette means 210, and in FIG. 5, cylindrical magnets 201 are disposed in the cassette means 210.

Also, FIG. 6 is a cross-sectional view illustrating the magnetic means 200, in which the magnets 201 are disposed in grooves formed in the cassette means 210.

According to one embodiment of the present invention, as shown in FIGS. 4, 5, and 6, each of the magnets 201 is disposed in such a manner that an axis connecting an N-pole to an S-pole is perpendicular to the plane of the cassette means 210.

Besides the detachable magnetic means 200 according to the present invention, in another method for changing the magnetic force of the magnetic means 200, the use of an electromagnet may be considered. However, the use of the electromagnet has problems as described below.

When an electromagnet is used, current flows. The flow of the current generates heat. The heat generated by the flow of the current may increase the temperature within a deposition chamber. In order to prevent the temperature from increasing, a cooling means has to be disposed around a current coil of the electromagnet. Furthermore, the periphery of the cooling means has to be sealed because fluid flowing in the cooling means is communicated with atmospheric air. In addition, since the cooling means is also disposed within a vacuum chamber, it requires a thick and rigid design for the prevention of deformation. In consideration of these design details, the weight of the electromagnet and the cooling means is about 130 kg or more, and the weight may cause damage to the substrate and deposition apparatus.

Also, in manufacturing the electromagnet, a coil is wound around a core. Herein, due to a problem such as heat generation, an interval between coils has to be in a range of 20 to 30 mm or more. The interval is ultimately the magnetizing interval, that is, an interval between magnets. There is a problem in that it is difficult to achieve a uniform magnetic force if the magnetizing interval is 20 mm or more. Meanwhile, in a case where a permanent magnet is used, since the magnetizing interval can be about 10 mm, it is advantageous to achieve uniformity of the magnetic force.

Also, in a case of an electromagnet, once a coil is wound, it is impossible to change the coil interval, and thus, there is no option but to use the electromagnet with the initially provided interval. In other words, in a case where the electromagnet is used, a peak value of the magnetic force can be changeable while the distribution of magnetic force cannot be changeable. This results in disadvantages.

Accordingly, in the present invention, a permanent magnet, instead of an electromagnet, is used. Furthermore, the permanent magnet 201 is mounted on the cassette means 210 so that the magnetic means can be easily replaced in the deposition apparatus.

Meanwhile, in order to efficiently hold a mask, the area of the cassette means 210 may be equal to or larger than that of the substrate 300. When magnets are disposed throughout the entirety of the above described cassette means 210, a magnetic force formed by the magnets 201 can be applied throughout the entire area of a mask means 400 so that the mask means 400 can be stably held.

Figure 7:
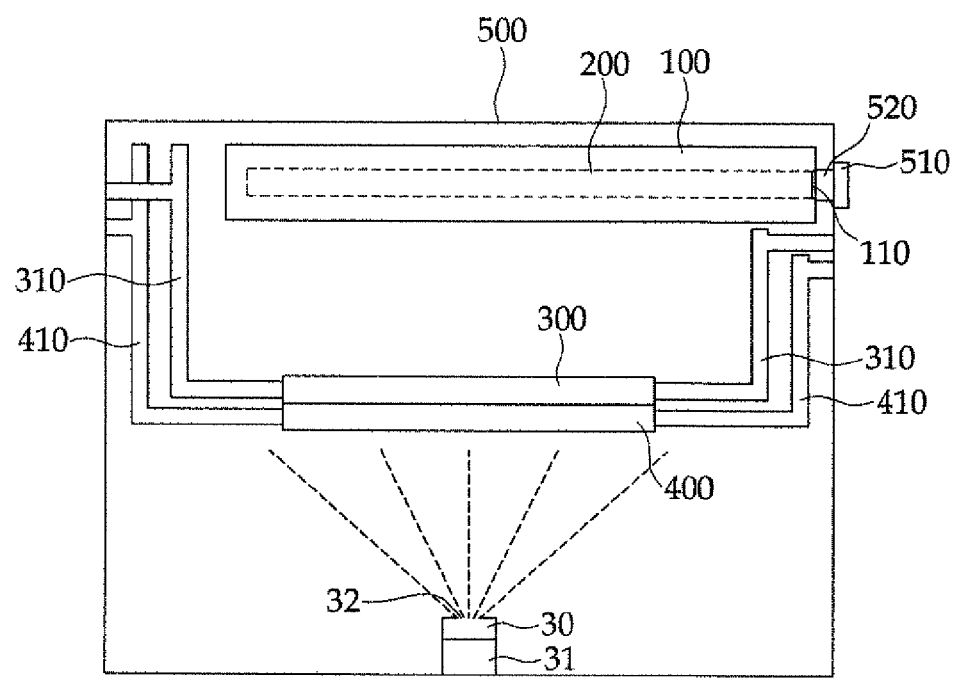
FIG. 7 is a view schematically illustrating a deposition apparatus according to one embodiment of the present invention.
Figure 8:
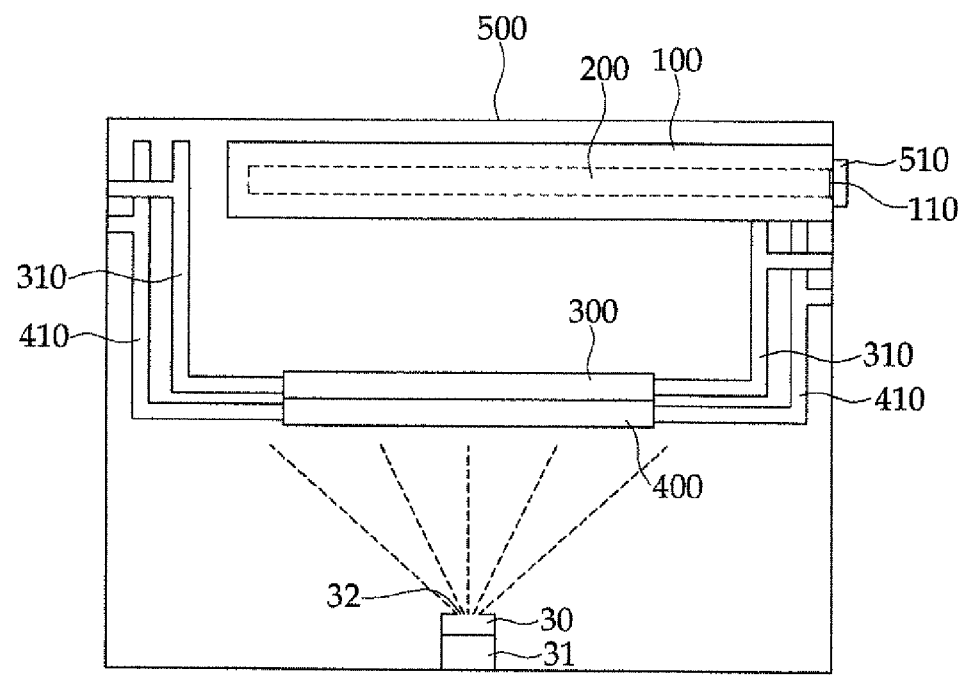
FIG. 8 is a view schematically illustrating a deposition apparatus according to another embodiment of the present invention.

FIG. 7 is a view schematically illustrating a deposition apparatus according to one embodiment of the present invention; and FIG. 8 is a view schematically illustrating a deposition apparatus according to another embodiment of the present invention.

The deposition apparatuses shown in FIGS. 7 and 8 include a mask holding device according to the present invention.

Specifically, a deposition apparatus according to one embodiment of the present invention includes: a chamber 500 which can form a vacuum atmosphere and provide a processing space for forming a deposition layer on a substrate 300; an evaporator source 30 disposed at the bottom of the chamber 500, and which stores an evaporant 31, and which evaporates the evaporant 31 so that the evaporated evaporant 31 can be jetted to the processing space; and a mask holding device disposed at the opposite side of the mask 400 across the substrate 300, and which holds the mask 400 on the substrate 300 by a magnetic force.

The deposition apparatus includes the mask holding device shown in FIG. 3, and the mask holding device comprises a substrate holder 100 for holding the substrate 300 and the magnetic means 200 inserted into the substrate holder 100.

As described above, with respect to FIG. 3, the substrate holder 100 is formed in a flat panel shape and has a receiving space therein. In at least one of the lateral sides of the substrate holder 100, the opening 110 is formed, which leads to the receiving space.

As also described above with respect to FIGS. 3 thru 6, the magnetic means 200 includes: the cassette means 210 formed with grooves for disposing magnets 201; and the magnets 201 detachably disposed in the grooves of the cassette means 210. Herein, the magnetic means 200 is detachably disposed in the receiving space of the substrate holder 100 through the opening 110 of the substrate holder 100.

Within the vacuum chamber 500 of the deposition apparatus of FIGS. 7 and 8, the substrate holder 100 and the magnetic means 200 are provided. Also, for deposition, the substrate 300 and the shadow mask 400 are introduced into the vacuum chamber. At the bottom of the vacuum chamber 500, the evaporator source 30, including the evaporant 31 and the vent 32, is disposed.

Also, at left and right sides of the substrate 300, substrate clamp units 310 are provided, and at left and right sides of the shadow mask 400, mask clamp units 410 are provided. The substrate clamp units 310 and the mask clamp units 410 not only adjust positions of the substrate 300 and the mask 400, respectively, so as to perform deposition, but also perform a role of positioning the substrate 300 and the mask 400, respectively.

In the operational process of the deposition apparatus, after the substrate 300 and the mask 400 are positioned by the clamp units 310 and 410, respectively, the magnetic force from the magnetic means 200 is applied to the mask 400 via the substrate 300. Accordingly, the mask 400 is fixed to the substrate 300. Then, the evaporator source 30, including the evaporant 31 therein, is heated and the evaporant 31 is evaporated or sublimated, and then deposited on the substrate 300 exposed through the mask 400.

Herein, the pressure within the vacuum chamber 500 is adjusted in such a manner that foreign substances cannot be introduced from the outside, and a vacuum state can be achieved. One or more evaporator sources 30 may be disposed at the bottom of the vacuum chamber 500. In the evaporator source 30, materials to be deposited are received. A vessel for the evaporator source 30 has a vent 32 at the upper side thereof. Through the vent 32, the evaporant 31 is jetted to the processing space of the chamber, and is deposited on the substrate 300. The mask 400 is positioned at the lower side of the substrate 300 so that the evaporant material can be deposited on a required area of the substrate 300.

Meanwhile, according to the size and type of substrate 300, it is necessary to change the size and the material of the mask 400. Accordingly, an optimum magnetic force allowing the mask to be tightly attached on the substrate 300 varies. In general, masks require different optimum magnetic forces appropriate for themselves. Thus, for the purpose of applying appropriate magnetic forces to different masks, the deposition apparatus according to the present invention is advantageous.

In general, in the deposition process, the chamber 500 is maintained in a vacuum state.

If the magnetic means 200 is fixed on a structure within the chamber 500, the replacement of the magnetic means 200 has to be performed after vacuum-releasing and opening the chamber 500. This may result in a great loss, because a series of processes, such as vacuum-releasing and opening of the chamber 500, and re-evacuating of the chamber 500 for deposition, require very considerable time and cost.

Meanwhile, in the present invention, the magnetic means 200 is disposed within the substrate holder 100, and can be easily replaced without vacuum-releasing of the chamber 500. Accordingly, the above mentioned conventional series of processes, in which the chamber 500 is vacuum-released, a magnetic means 200 is replaced, and the chamber 500 is re-evacuated, are not required.

In the deposition apparatus shown in FIG. 7, according to one embodiment of the present invention, a passage 520 is provided, which allows the magnetic means 200 to be introduced into the chamber 500 or removed from the outside.

Herein, the passage 520 leads to the opening 110 of the substrate holder 100, and the receiving space of the substrate holder 100 is kept airtight in areas except for the opening 110. Accordingly, other areas of the chamber 500 can be maintained in a vacuum state.

Meanwhile, at the side wall of chamber 500 leading to the passage 520, a switching part 510 is formed. When the magnetic means 200 is introduced or removed, the switching part 510 is opened. Otherwise, the switching part 510 is closed.

As described above, the switching part 510 and the passage 520 allow the receiving space within the substrate holder 100 to be accessed from the outside. Thus, it is possible to replace the magnetic means 200 without having any effect on the vacuum state of the chamber 500.

According to one embodiment of the present invention, an additional carrying means may be provided so that the magnetic means 200 introduced from the outside of the chamber 500 can be carried to the opening 110 of the substrate holder 100, and can then be disposed in the receiving space of the substrate holder 100. There is no particular limitation as to the kind of such a carrying means. For example, a robot arm may be used.

According to another embodiment of the present invention, as shown in FIG. 8, the side wall of substrate holder 100 having the opening 110 leads to the side wall of chamber 500. Also, a part of the side wall of chamber 500, corresponding to the opening 110, is opened, and the receiving space of the substrate holder 100 is kept airtight in areas except for the opening 110.

Herein, at the side wall of chamber 500, corresponding to the opening 110, a switching part 510 may be formed. When the magnetic means 200 is introduced or removed, the switching part 510 may be opened. Otherwise, the switching part 510 may be closed.

According to one embodiment of the present invention, in the magnetic means 200, a plurality of permanent magnets is disposed. The permanent magnets are disposed in such a manner that respective adjacent magnets can have opposite polarities.

According to one embodiment of the present invention, the magnets 201 (FIGS. 3 thru 6) disposed on the cassette means 210 can be also detachable. Thus, it is possible to easily adjust the magnetic force of the magnetic means 200.

Preferably, each of the magnets 201 is disposed in the cassette means 210 in such a manner that an axis connecting an N-pole to an S-pole is perpendicular to the plane of the cassette means.

According to one embodiment of the present invention, the area of the cassette means 210 may be equal to or larger than that of the substrate 300. When magnets 201 are disposed throughout the entirety of the above described cassette means 210, a magnetic force formed by the magnets 201 can be applied throughout the entire area of a mask means 400 so that the mask means 400 can be stably held.

Although a preferred embodiment of the present invention has been described for illustrative purposes, those skilled in the art will appreciate that various modifications, additions and substitutions are possible without departing from the scope and spirit of the invention as disclosed in the accompanying claims.

What is claimed is:

1. A mask holding device, comprising:
    a substrate holder for holding a substrate; and
    magnetic means insertable into the substrate holder for providing a magnetic force;
    wherein the substrate holder is formed in a flat panel shape having an interior hollow space to receive and hold the magnetic means, an opening being formed in at least one of lateral sides of the substrate holder, the opening leading to the interior hollow space;
    wherein the magnetic means comprises a cassette formed with grooves for disposing magnets therein, the magnets being disposed in the grooves of the cassette; and
    wherein the magnetic means is insertable into the interior hollow space from the opening of the substrate holder and is thereby detachably disposed in the substrate holder.

2. The mask holding device as claimed in claim 1, wherein a plurality of permanent magnets are disposed in the magnetic means, the permanent magnets being disposed in such a manner that respective adjacent magnets have opposite polarities.

3. The mask holding device as claimed in claim 1, wherein the magnets disposed in the cassette are detachable.

4. The mask holding device as claimed in claim 1, wherein each of the magnets is disposed in such a manner that an axis connecting an N-pole to an S-pole of each magnet is perpendicular to a plane of the cassette.

5. The mask holding device as claimed in claim 1, wherein an area of the cassette is not less than an area of the substrate.

6. A deposition apparatus, comprising:
    a chamber which is capable of forming a vacuum atmosphere, and which provides a processing space for forming a deposition layer on a substrate;
    an evaporator source disposed at a bottom of the chamber for storing an evaporant, the evaporant being evaporated so that the evaporated evaporant is jetted to the processing space; and
    a mask holding device disposed at an opposite side of a mask across the substrate for holding the mask on the substrate by a magnetic force;
    wherein the mask holding device comprises a substrate holder for holding the substrate, and magnetic means inserted in the substrate holder for providing the magnetic force;
    wherein the substrate holder is formed in a flat panel shape having an interior hollow space to receive and hold the magnetic means, an opening being formed in at least one of lateral sides of the substrate holder, the opening leading to the interior hollow space;
    wherein the magnetic means comprises a cassette formed with grooves for disposing magnets therein, the magnets being detachably disposed in the grooves of the cassette; and
    wherein the magnetic means is insertable into the interior hollow space from the opening of the substrate holder and is thereby detachably disposed in the substrate holder.

7. The deposition apparatus as claimed in claim 6, wherein a plurality of permanent magnets are disposed in the magnetic means, the permanent magnets being disposed in such a manner that respective adjacent magnets have opposite polarities.

8. The deposition apparatus as claimed in claim 6, wherein the magnets disposed in the cassette are detachable.

9. The deposition apparatus as claimed in claim 6, wherein each of the magnets is disposed in such a manner that an axis connecting an N-pole to an S-pole of each magnet is perpendicular to a plane of the cassette.

10. The deposition apparatus as claimed in claim 6, wherein an area of the cassette is not less than an area of the substrate.

11. The deposition apparatus as claimed in claim 6, wherein a passage is provided at the chamber, said passage allowing the magnetic means to be introduced to or removed from an outside area.

12. The deposition apparatus as claimed in claim 11, wherein the passage leads to the opening of the substrate holder, and the receiving space of the substrate holder is kept airtight in areas except for the opening.

13. The deposition apparatus as claimed in claim 6, further comprising carrying means for carrying the magnetic means, when introduced from outside the chamber, to the opening of the substrate holder.

14. The deposition apparatus as claimed in claim 6, wherein a side wall of the substrate holder has the opening, said opening leads to a side wall of the chamber, a part of the side wall of the chamber corresponding to the opening is opened, and the receiving space of the substrate holder is kept airtight in areas except for the opening.

* * * * *